(12) United States Patent
Andoh

(10) Patent No.: US 6,627,988 B2
(45) Date of Patent: Sep. 30, 2003

(54) SEMICONDUCTOR DEVICE AND METHOD FOR MANUFACTURING THE SAME

(75) Inventor: Seiji Andoh, Kanagawa (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 22 days.

(21) Appl. No.: 09/783,013

(22) Filed: Feb. 15, 2001

(65) Prior Publication Data

US 2001/0028110 A1 Oct. 11, 2001

(30) Foreign Application Priority Data

Apr. 6, 2000  (JP) .................................... 2000-104732

(51) Int. Cl.⁷ .............................................. H01L 23/42
(52) U.S. Cl. ..................................................... 257/706
(58) Field of Search .................................. 257/706, 707

(56) References Cited

U.S. PATENT DOCUMENTS

| 5,229,643 | A | * | 7/1993 | Ohta et al. | 257/706 |
| 5,554,887 | A | | 9/1996 | Sawai et al. | |
| 5,903,052 | A | * | 5/1999 | Chen et al. | 257/706 |
| 5,920,117 | A | * | 7/1999 | Sono et al. | 257/666 |
| 6,184,580 | B1 | * | 2/2001 | Lin | 257/706 |
| 6,219,243 | B1 | * | 4/2001 | Ma et al. | 257/706 |
| 6,259,156 | B1 | * | 7/2001 | Kohno et al. | 257/706 |
| 2001/0009302 | A1 | * | 7/2001 | Murayama et al. | 257/704 |

FOREIGN PATENT DOCUMENTS

| JP | 06-342794 | 12/1994 |
| JP | 11-307694 | 5/1999 |
| JP | 2000-68423 | 3/2000 |

* cited by examiner

Primary Examiner—George Fourson
(74) Attorney, Agent, or Firm—Rabin & Berdo, P.C.

(57) ABSTRACT

A resin sealed type semiconductor device is provided with a semiconductor chip which has a pad formed on a main surface thereof, an insulating film which is formed on a part of the pad and on the main surface of the semiconductor chip, an interconnection which is formed on a part of the insulating film and which is electrically connected to the pad, a sealing resin which seals the interconnection and the insulating film, a post formed on the interconnection which has a surface exposed to outside of the sealing resin and which is electrically connected to the interconnection, a bump electrode which is mounted on the exposed surface of the post and a radiation post which is formed on the insulating film and which has a surface exposed to outside of the sealing resin.

23 Claims, 12 Drawing Sheets

SEMICONDUCTOR DEVICE AND METHOD FOR MANUFACTURING THE SAME

BACKGROUND OF THE INVENTION

1. Field of the Invention

The present invention generally relates to technology for manufacturing a semiconductor device, and more particularly, to a semiconductor device which has improved radiation efficiency and a method for manufacturing the semiconductor device.

This application is a counterpart of Japanese patent application, Serial Number 104732/2000, filed Apr. 6, 2000, the subject matter of which is incorporated herein by reference.

2. Description of the Related Art

Recently, the spread of mobile terminals has been accelerated, and smaller, thinner and lighter mobile terminals are desired. In order to achieve compactness, effort has been made to reduce the size of the semiconductor devices mounted on the mobile terminal. Such efforts are focused on the development of semiconductor devices having a semiconductor package about the size of a chip, referred to as Chip Size Package (hereinafter CSP).

The size of CSP is substantially the same as that of the chip or slightly larger. There is a resin sealed type semiconductor device which is referred to as Wafer Level Chip Size Package/Wafer Level Chip Scale Package (hereinafter W-CSP) among CSP. The size of W-CSP is the same as that of the chip.

The conventional CSP type semiconductor device will be described with reference to FIGS. 12–14.

FIG. 12 is an entire perspective view showing a wafer and the conventional resin sealed type semiconductor device taken by dicing the wafer. FIG. 13 is a cross sectional view taken line A—A of the semiconductor device shown in FIG. 12. As shown in FIG. 13, the conventional resin sealed type semiconductor device comprises a semiconductor chip 1301, posts 1302, solder bumps 1303, connector members 1304, a sealing resin 1305, pads 1306 and an insulating film 1308. The semiconductor chip 1301 has a main surface 1301a in which a circuit, e.g. a transistor etc., is formed. The pads 1306, which are made of aluminum, are formed on the main surface 1301a of the semiconductor chip 1301. The insulating film 1307 is formed on the main surface 1301a of the semiconductor chip 1301. The connector members 1304 are electrically connected to the pads 1306 and to the posts 1302. The connector members 1304 function as interconnectors, and are made of copper. The posts 1302, which are made of copper, are formed on the connector members 1304. The solder bumps 1303 are mounted on the upper surfaces of the posts 1302, and are electrically connected to the posts 1302. The solder bumps 1303 provide partly-spherical electrodes. The sealing resin 1305 seals the insulating film 1307, the connector members 1304, and the posts 1302 except for the solder bumps 1303. Now, due to explanatory convenience, the number of posts 1302 etc is limited to one or two in the drawings.

Processes which include a process of mounting the solder bumps 1303, are performed in a wafer state. After these processes are completed, the wafer is diced. Thereby, the conventional resin sealed type semiconductor device, which is called CSP, is obtained (refer to FIG. 13).

The heat radiation path of a conventional resin sealed type semiconductor device will be described with reference to FIG. 14. As shown in FIG. 14, the conventional resin sealed type semiconductor device is mounted on a substrate 1401 via the solder bumps 1303. Arrows shown in FIG. 14 designate the radiation path of the heat radiated from the semiconductor chip 1301 to the outside of the semiconductor device. As shown in FIG. 14, the heat generated near the main surface 1301a of the semiconductor chip 1301, is radiated via the posts 1302, the solder bumps 1303 and the substrate 1401.

However, the main surface 1301a of the semiconductor chip 1301 is covered with the sealing resin 1305, which has a low thermal conductivity. Therefore, the radiation or heat flow path near the main surface 1301a, is limited to the path explained above. Consequently, the heat near the main surface is dissipated well enough.

SUMMARY OF THE INVENTION

It is an object of the present invention to provide a resin sealed type semiconductor device that may improve radiation efficiency.

It is another object of the present invention to provide a method for making a semiconductor device that may reduce manufacturing costs.

It is still another object of the present invention to provide a method for making a semiconductor device that may reduce manufacturing steps.

It is further object of the present invention to provide a method of making a semiconductor device that may reduce a manufacturing time period.

According to one aspect of the present invention, for achieving the above objects, there is provided a resin sealed type semiconductor device that includes a semiconductor chip having a pad which is formed on a main surface thereof, an insulating film formed on a part of the pad and on the main surface of the semiconductor chip, an interconnection formed on a part of the insulating film, being electrically connected to the pad, a sealing resin sealing the interconnection and the insulating film, a post unit formed on the insulating film, having an edge side exposed to outside of the sealing resin, being electrically connected to the interconnection, a bump formed on the exposed edge side of the post unit and a radiation post unit formed on the insulating film, having an edge side exposed to outside of the sealing resin.

The above and further objects and novel features of the invention will more fully appear from the following detailed description, appended claims and the accompanying drawings.

DETAILED DESCRIPTION OF THE PREFERRED EMBODIMENTS

In what follows, the present invention will be explained with embodiments of the present invention. However, the invention is not limited to the specific embodiments. Moreover, not all the combinations of the characteristics of the present invention described in the embodiments are essential to the problem solving means by the present invention.

First Preferred Embodiment

A resin sealed type semiconductor device according to a first preferred embodiment of the present invention will be described with reference to FIGS. 1–5.

Figure 1:
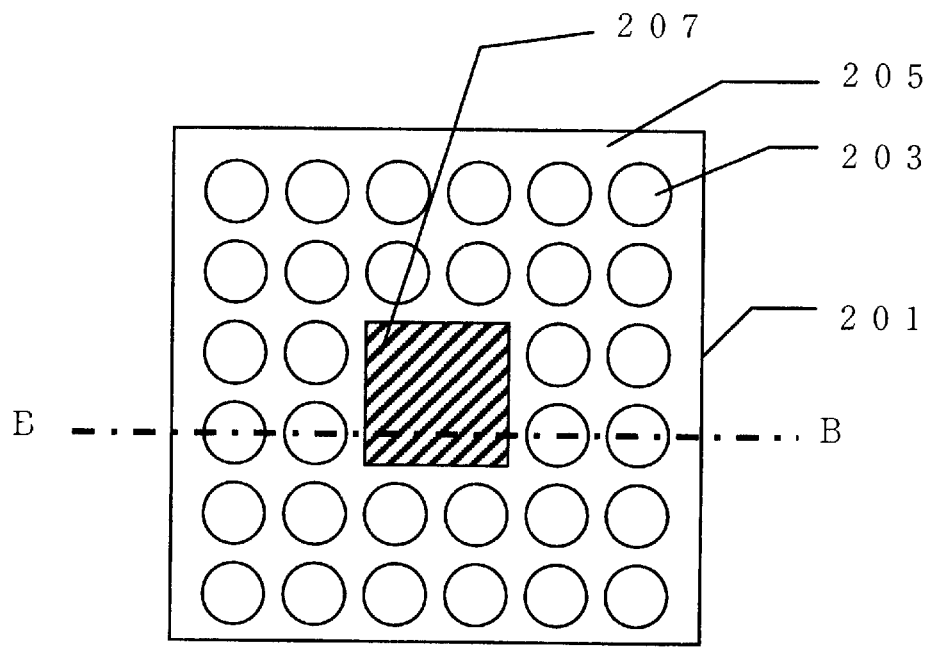
FIG. 1 is a plane view showing a resin sealed type semiconductor device according to a first preferred embodiment of the present invention.
Figure 2:
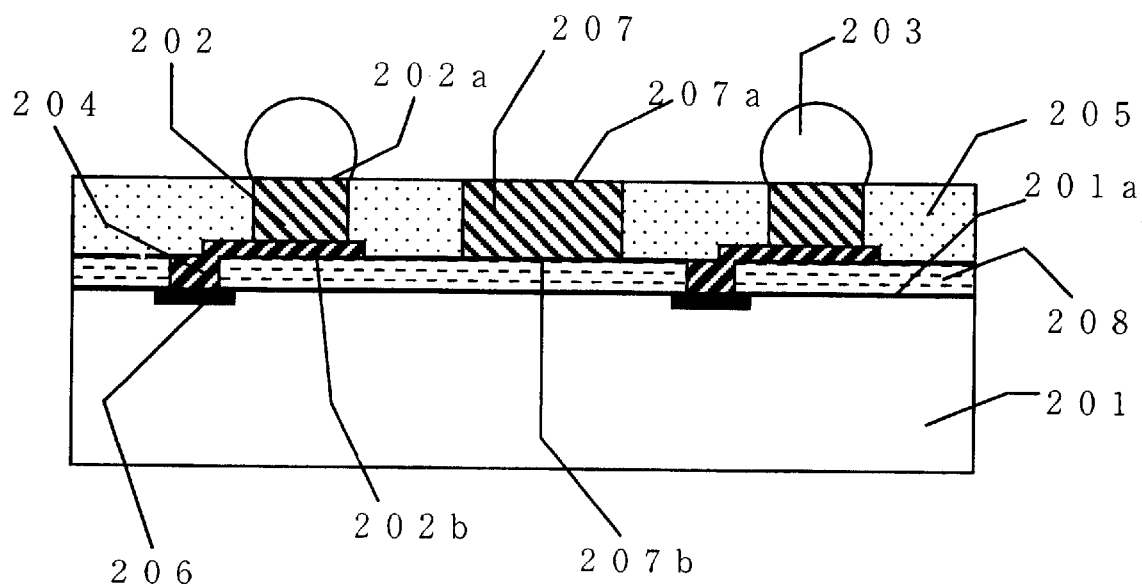
FIG. 2 is a cross sectional view showing a resin sealed type semiconductor device according to a first preferred embodiment of the present invention.

First, the composition of the resin sealed type semiconductor device according to the first preferred embodiment will be described with reference to FIGS. 1–2. FIG. 1 is a plane view showing the resin sealed type semiconductor device having a wafer level chip size package structure individually divided from a wafer. FIG. 2 is a cross sectional view taken along line B—B of the semiconductor device shown in FIG. 1. The resin sealed type semiconductor device according to the first preferred embodiment of the present invention comprises a semiconductor chip 201, a plurality of posts 202, a plurality of solder bumps 203, a plurality of connector members 204, a sealing resin 205, a plurality of pads 206, a radiation or heat transfer post 207 and an insulating film 208. As illustrated in FIG. 1, two solder bumps 203 are located at each side of the radiation post 207. However, for the sake of convenience in some of the drawings, the number of the pads, the connector members, the posts and the solder bumps is limited in FIG. 2.

The semiconductor chip 201 has a main surface 201a. The circuits such as a transistor etc. are formed on the main surface 201a of the semiconductor chip 201.

The pads 206, which are preferably made of aluminum or the like, and are formed on the main surface 201a of the semiconductor chip 201.

The insulating film 208 is formed on the main surface 201a of the semiconductor chip 201 and on a partial surface of the pads 206. The insulating film 208 protects the main surface 201a.

The connector members 204, which are preferably made of copper, aluminum or titanium or the like, have portions that are formed on the pads 206 and portions that extend on the insulating film 208. The connector members 204 are electrically connected to the pads 206. The connector members 204 provide interconnections in order to freely adjust the positions of the posts 202. Therefore, the posts 202 can be formed at positions which are not aligned with the pads 206, in addition to on the pads 206.

The posts 202 are preferably made of copper or aluminum or the like, and each one has a first end side 202a and a second end side 202b. As mentioned above, the posts 202 are formed on the connector members 204, and are electrically connected to the connector members 204. The second end side 202b is the opposite side of the connector members 204.

The solder bumps 203 have partially sphericalshapes, and are preferably made of solder, and each one is mounted on the first end side 202a of a post 202. The solder bumps 203 are electrically connected to the posts 202. As a result, the pads 206, the connector members 204, the posts 202 and the solder bumps 203 are electrically connected.

The radiation post 207 is preferably made of copper or aluminum or the like, and is formed at the center position of the main surface 201a of the semiconductor chip 201. The radiation post 207 has a main surface 207a and a back surface 207b. The main surface 207a of the radiation post 207 is exposed to the outside of the sealing resin 205 and the back surface 207b of the radiation post 207 is contacted with the insulating film 208.

It is desirable that the radiation post 207 is formed so as not to contact with the posts 202, the pads 206 or the connector members 204. If the radiation post 207 is contacted with the posts 202, this contact would cause the posts 202 to electrically connect to each other, but it has nothing to do with a role as a radiation post. Therefore, there is a possibility that the posts 202 might short-circuit. Thus, this means that the posts 202 must not lose their function as electrodes. The function of the connection members 204 and the pads 206 are the same as that explained above.

The sealing resin 205 is preferably made of epoxy resin or the like, and seals the posts 202, the connection members 204, the radiation post 207 and the insulating film 208. The main surface 207a of the radiation post 207 is exposed to the outside of the sealing resin 205.

Figure 3:
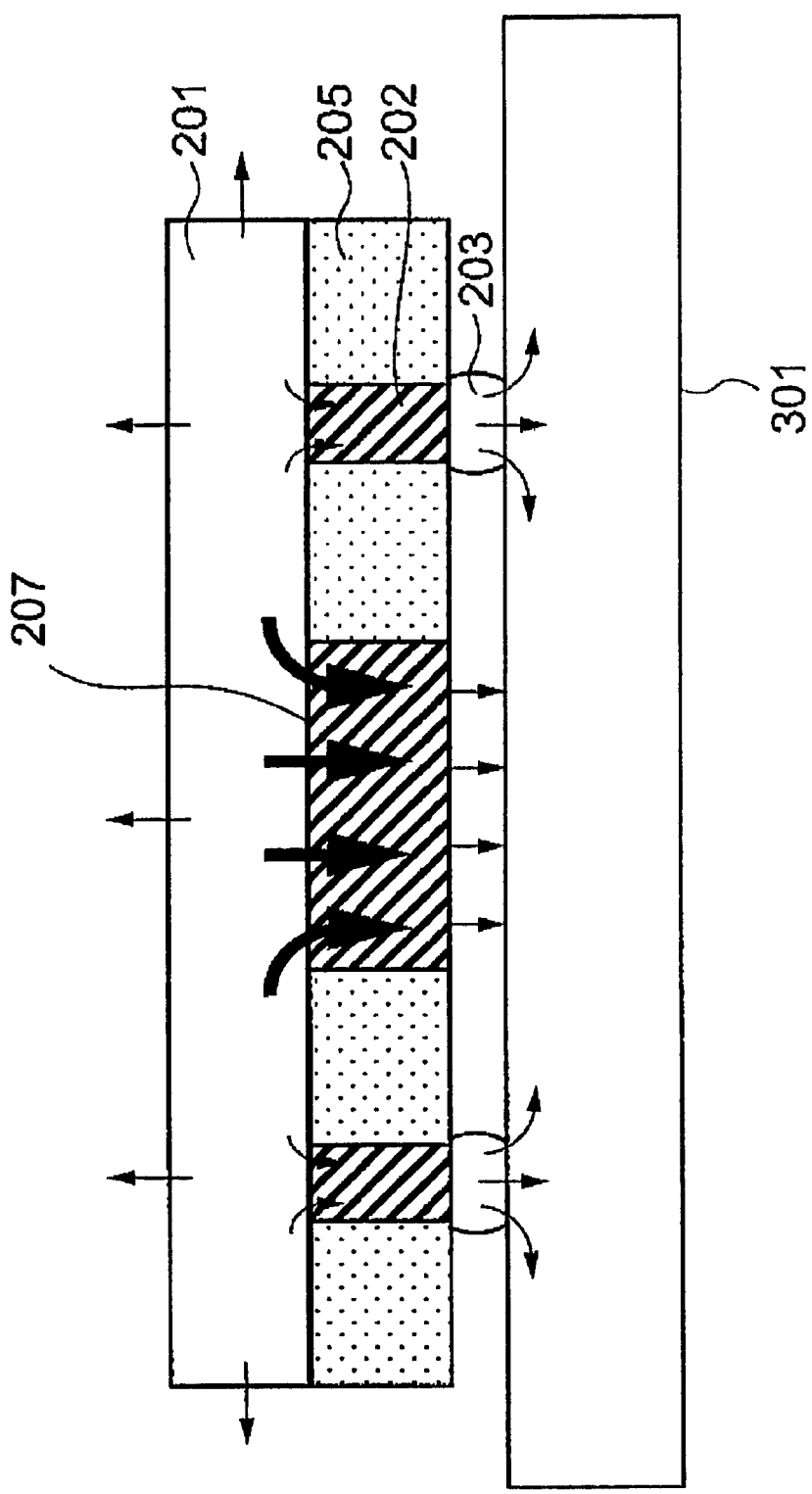
FIG. 3 is a cross sectional view showing the radiation or heat flow paths of a resin sealed type semiconductor device according to a first preferred embodiment of the present invention.

The radiation or heat flow of the resin sealed type semiconductor device according to a first preferred embodiment of the present invention will be described with reference to FIG. 3. FIG. 3 is a cross sectional view showing radiation flow of a resin sealed type semiconductor device according to a first preferred embodiment. The resin sealed type semiconductor device is connected to a substrate 301 via the solder bumps 203. The arrows shown in FIG. 3 designate the routes conducting the heat that occurs in the semiconductor chip 201. As shown in FIG. 3, the heat generated in the semiconductor chip 201 is radiated to the outside of the semiconductor chip 201 via the back and side surfaces of the semiconductor chip 201. In addition, the heat near the main surface 201a of the semiconductor chip 201 is conducted to the substrate 301 via the posts 202 and the solder bumps 203, and thus the heat is radiated to the outside of the resin sealed type semiconductor device. Furthermore, the heat near the main surface 201a of the semiconductor chip 201 is radiated to an area which exists between the resin sealed type semiconductor device according to the first preferred embodiment and the substrate 301 via the radiation post 207.

The resin sealed type semiconductor device according to the first preferred embodiment of the present invention is capable of radiating the heat generated in the semiconductor chip 201 to its outside by using the posts 202, the solder bumps 203 and the radiation post 207. Therefore, the resin sealed type semiconductor device according to the first preferred embodiment of the present invention is capable of radiating the heat efficiently as compared with the conventional resin sealed type semiconductor device. Thus, the resin sealed type semiconductor device according to the first preferred embodiment of the present invention is capable of reducing thermal resistance and controlling high temperature of the semiconductor chip as compared with the conventional resin sealed type semiconductor device. As a result, a longer lifetime can be obtained for the resin sealed type semiconductor device according to the first preferred embodiment.

The process of manufacturing the resin sealed type semiconductor device according to the first preferred embodiment of the present invention will be described with reference to FIGS. 4A–4D and 5A–5D. The drawings are schematic enlarged sectional views of a part of the wafer.

Figure 4A:
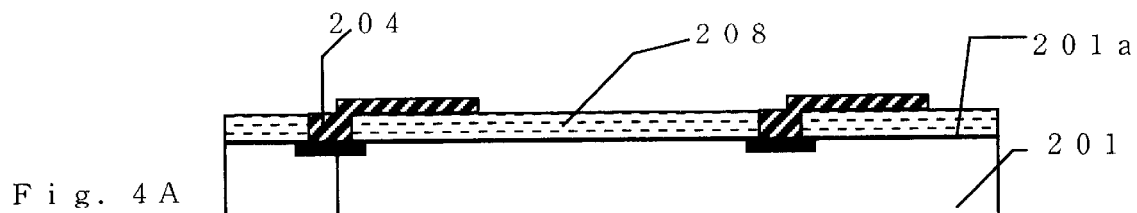
FIG. 4(a) through FIG. 4(d) are process diagrams showing a method for manufacturing a resin sealed type semiconductor device according to first, second and third embodiments of the present invention.

First, as shown in FIG. 4A, the wafer (the semiconductor chip) 201 having the main surface 201a on which a circuit such as a transistor or the like is formed, is prepared. The pads 206 are formed on the main surface 201a of the wafer 201. The connector members 204, which are electrically connected to the pads 206, have portions that are formed on the pads 206 and portions that extend on the insulating film 208. The insulating film 208 is formed on the main surface 201a, except for areas at which the connector members 204 are formed.

Figure 4B:
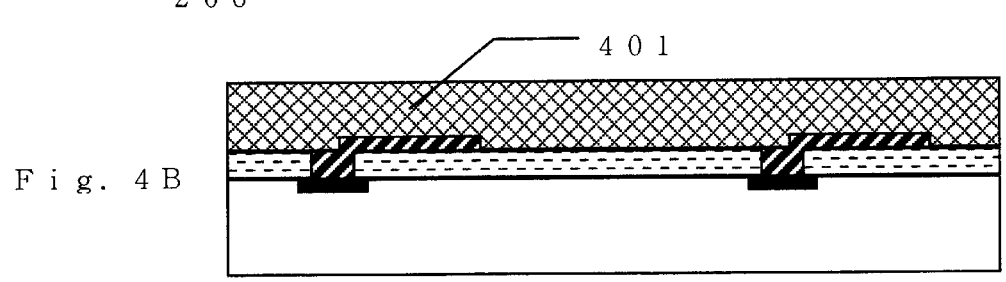

Next, as shown in FIG. 4B, a photosensitivity resin called as a photoresist film 401 is spin-coated on the insulating film 208 and the connector members 204. The film thickness of the photoresist film 401 needs to be as large as the height of the posts 202 and the radiation post 207 to be formed as the following steps.

Figure 4C:
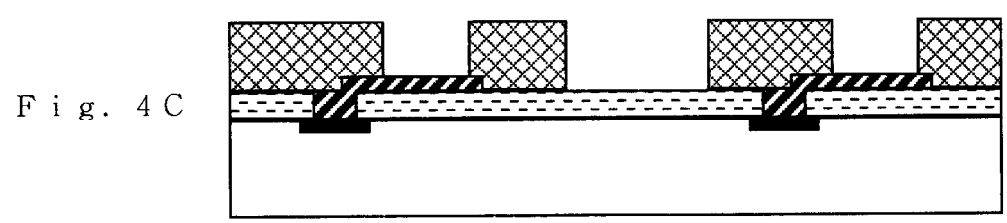

Next, as shown in FIG. 4C, the photoresist film 401 is masked, and the masked photoresist film 401 is lithographed in order to expose a part of the connector members 204 and the insulating film 208. The size of the mask is set to the size of the posts 202 and the radiation post 207. The exposed photoresist film 401 is developed, and thus openings are formed in the photoresist film 401.

Figure 4D:
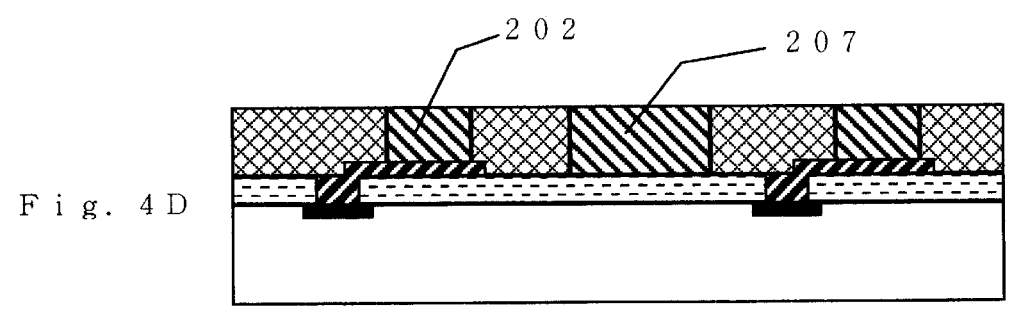

Next, as shown in FIG. 4D, the wafer with the photoresist film 401 having the openings, is soaked in a plating liquid and thus the openings are filled with the plating liquid. The kind of plating liquid that is used depends on the material of the posts 202 and the radiation post 207. If the posts 202 and the radiation post 207 are made of copper or aluminum, a copper plating liquid or an aluminum plating liquid are used.

Figure 5A:
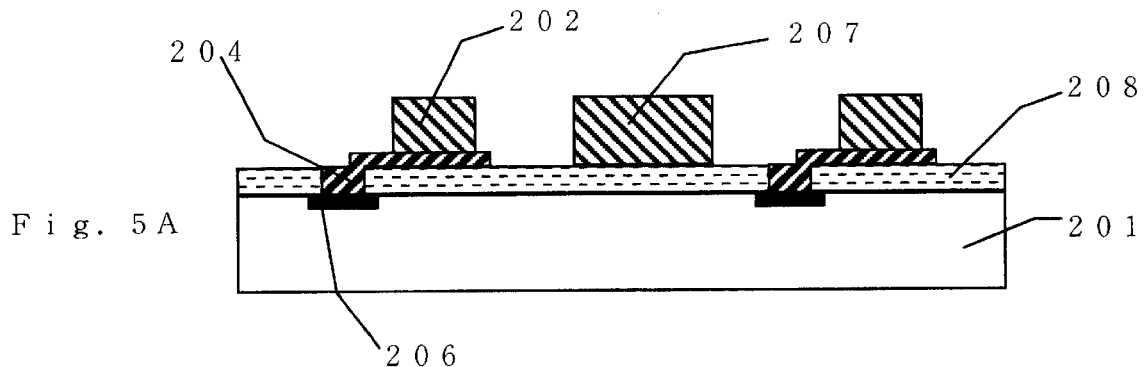
FIG. 5(a) through FIG. 5(d) are process diagrams showing a method for manufacturing a resin sealed type semiconductor device according to first, second and third embodiments of the present invention.

Next, as shown in FIG. 5A, after the plating liquid becomes a solid state, the photoresist film 401 is removed from the wafer. Thereby, the posts 202 and the radiation post 207 are obtained.

Figure 5B:
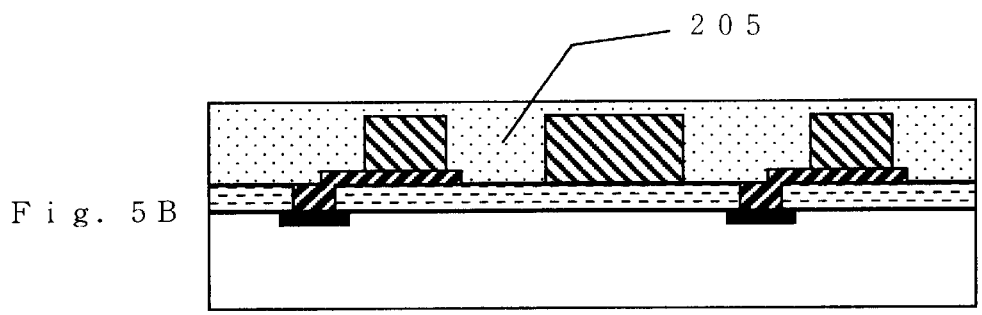

Next, as shown in FIG. 5B, the posts 202, the connector members 204, the radiation post 207 and the insulating film 208 are sealed with the sealing resin 205 by using a transfer-mold method or potting method or the like.

Figure 5C:
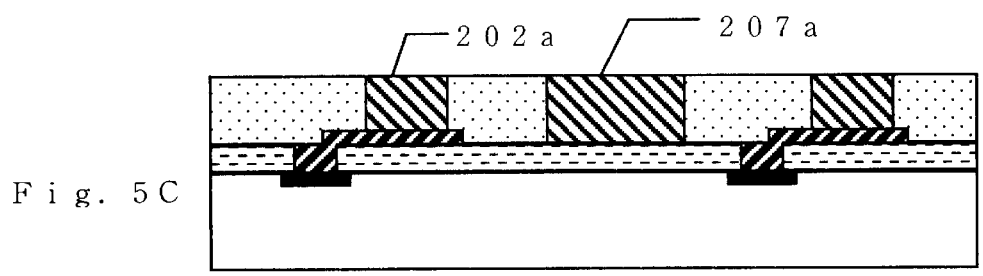

Next, as shown in FIG. 5C, the entire surface of the sealing resin 205 is etched or ground. As a result, the first end sides 202a of the posts 202 and the main surfaces 207a of the radiation post 207 are exposed.

Figure 5D:
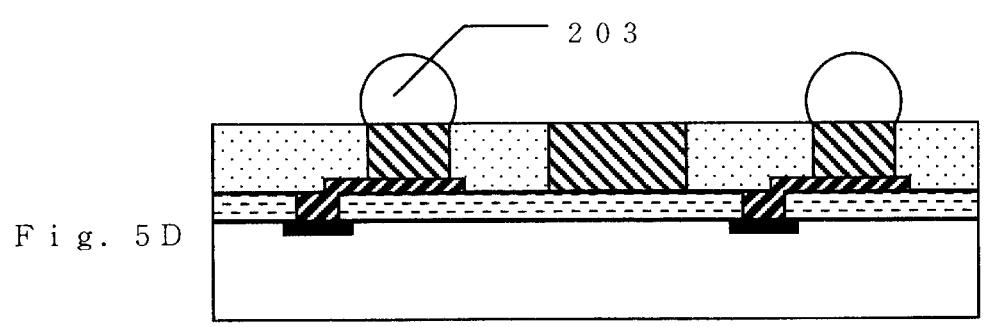

Next, as shown in FIG. 5D, the solder bumps 203 are mounted on the first end sides 202a of the posts 202 by using the screen-printing method, the solder-plating method or the super-soldering method or the like.

In the process of manufacturing the resin sealed type semiconductor device according to the first preferred embodiment of the present invention, the radiation post 207 can be formed simultaneously in the process of forming the posts 202. Therefore, special processes do not need to be used to form the radiation post 207. Thus, the processes can be performed efficiently.

In FIGS. 1–2, owing to convenience of illustration, the number of the posts 202, the solder bumps 203, the connector members 204 and the pads 206 are limited to a specific number, i.e. two. However, even if the above number is changed, the resin sealed type semiconductor device according to the first preferred embodiment of the present invention is capable of getting the same effect.

Second Embodiment

A resin sealed type semiconductor device according to a second preferred embodiment of the present invention will be described with reference to FIGS. 6–8.

First, the composition of the resin sealed type semiconductor device according to the second preferred embodiment will be described with reference to FIGS. 6–7. FIG. 6 is a plane view showing a resin sealed type semiconductor device having a wafer level chip size package structure individually divided from a wafer. FIG. 7 is a cross sectional view taken line C—C of the semiconductor device shown in FIG. 6. Like elements are given like or corresponding reference numerals in the first and second preferred embodiments. Thus, dual explanations of the same elements are avoided. The resin sealed type semiconductor device according to the second preferred embodiment of the present invention comprises a semiconductor chip 201, a plurality of posts 202, a plurality of solder bumps 203, a plurality of connector members 204, a sealing resin 205, a plurality of pads 206, a radiation post 207, an insulating film 208 and a plurality of radiation bumps 701. As illustrated in FIG. 6, two solder bumps 203 are located at each side of the radiation post 207. However, owing to convenience of illustration, the number of the pads, the connector members, the posts and the solder bumps is limited in FIG. 7.

The difference between the first and the second preferred embodiments is that the radiation bumps 701 are mounted on the main surface 207a of the radiation post 207.

The radiation bumps 701 have a partially spherical shape, and are preferably made of solder, and each one is mounted on the main surface 207a of the radiation post 207.

The radiation or heat flow of the resin sealed type semiconductor device according to the second preferred embodiment of the present invention will be described with reference to FIG. 8. FIG. 8 is a cross sectional view showing the heat flow of a resin sealed type semiconductor device according to the second preferred embodiment. The resin sealed type semiconductor device is connected to a substrate 801 via the solder bumps 203 and the radiation bumps 701. The arrows shown in FIG. 8 designate the routes conducting the heat generated in the semiconductor chip 201. As shown in FIG. 8, the heat generated in the semiconductor chip 201 is radiated to the outside of the semiconductor chip 201 via the back and side surfaces of the semiconductor chip 201. In addition, the heat near the main surface 201a of the semiconductor chip 201 is conducted to the substrate 801 via the posts 202 and the solder bumps 203, and thus the heat is radiated to the outside of the resin sealed type semiconductor device. Furthermore, the heat near the main surface 201a of the semiconductor chip 201 is radiated to an area which exists between the resin sealed type semiconductor device according to the second preferred embodiment and the substrate 801 via the radiation post 207. Furthermore, the heat near the main surface 201a of the semiconductor chip 201 is conducted to the substrate 801 via the radiation posts 207 and the radiation bumps 701.

The resin sealed type semiconductor device according to the second preferred embodiment of the present invention is capable of radiating the heat generated in the semiconductor chip 201 to its outside by using the posts 202, the solder bumps 203 and the radiation post 207. Therefore, the resin sealed type semiconductor device according to the second preferred embodiment of the present invention is capable of radiating the heat efficiently as compared with the conventional resin sealed type semiconductor device. Thus, the resin sealed type semiconductor device according to the second preferred embodiment of the present invention is capable of reducing the thermal resistance and controlling high temperature of the semiconductor chip as compared with the conventional resin sealed type semiconductor device. As a result, a longer lifetime can be obtained for the resin sealed type semiconductor device according to the second preferred embodiment.

Furthermore, the resin sealed type semiconductor device according to the second preferred embodiment of the present invention has heat flow paths to its outside by using the radiation bumps 701. Thus, the resin sealed type semiconductor device according to the second preferred embodiment of the present invention is capable of further reducing the thermal resistance and controlling high temperature of the semiconductor chip as compared with the conventional resin sealed type semiconductor device. As a result, a longer lifetime can be obtained for the resin sealed type semiconductor device according to the second preferred embodiment. The process of manufacturing the resin sealed type semiconductor device according to the second preferred embodiment of the present invention will be described with reference to FIGS. 4A–4D and 5A–5C. The drawings are the schematic enlarged sectional views a part of the wafer. All processes from a process of preparing the wafer 201 (refer to FIG. 4A) to a process of exposing the first end sides 202a of the posts 202 and the main surface 207a of the radiation post 207 (refer to FIG. 5C), are the same as those of the first embodiment.

The difference between the first and the second preferred embodiments is that the radiation bumps 701 are mounted on the main surface 207a of the radiation post 207 during the process shown in FIG. 5D. In detail, the solder bumps 203 and the radiation bumps 701 are mounted on the first end sides 202a of the posts 202 and the main surface 207a of the radiation post 207, respectively, by using the screen-printing method, the solder-plating method or the super-soldering method, etc.

In the process of manufacturing the resin sealed type semiconductor device according to the second preferred embodiment of the present invention, the radiation bumps 701 can be formed simultaneously in the process of forming the solder bumps 203. Therefore, special processes do not need to be used to form the radiation bumps 701. Thus, the processes can be performed efficiently.

Figure 6:
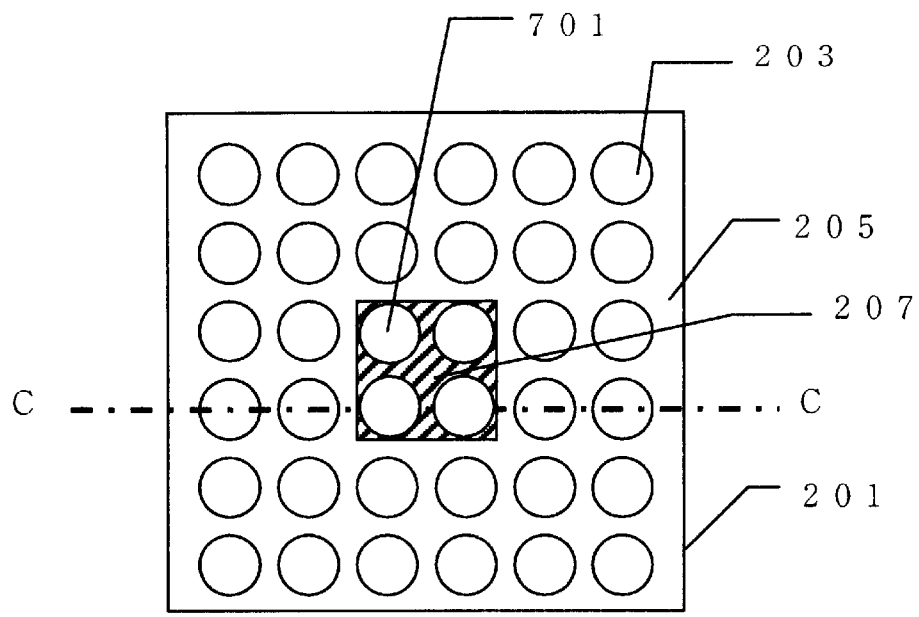
FIG. 6 is a plane view showing a resin sealed type semiconductor device according to a second embodiment of the present invention.
Figure 7:
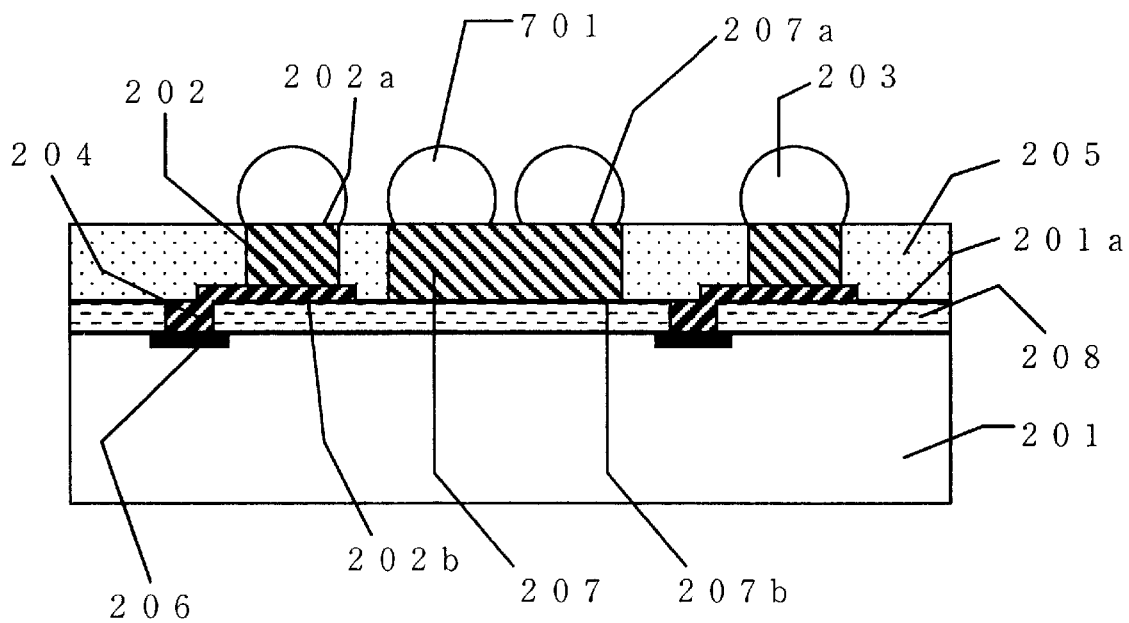
FIG. 7 is a cross sectional view showing a resin sealed type semiconductor device according to a second embodiment of the present invention.
Figure 8:
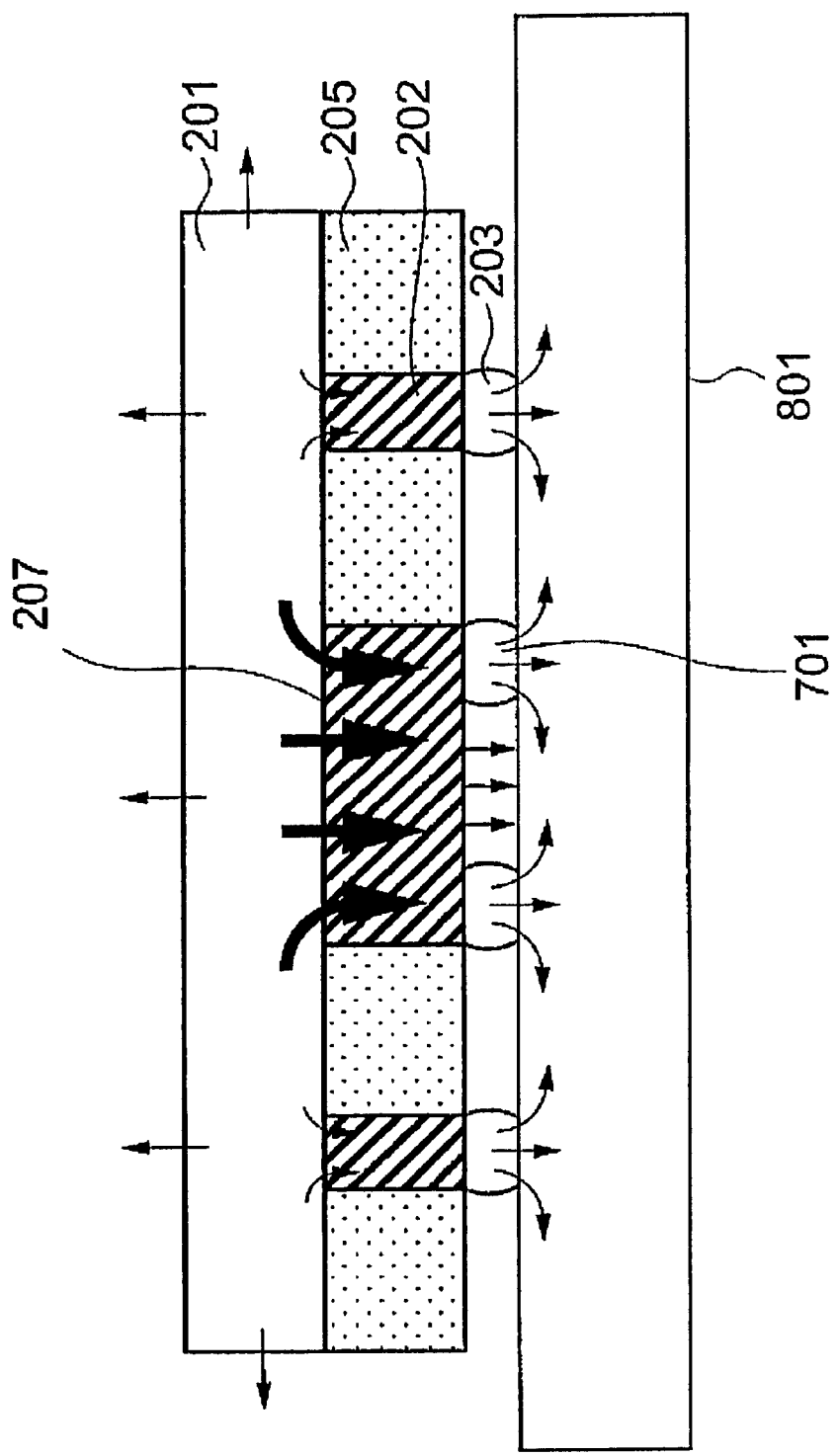
FIG. 8 is a cross sectional view showing radiation passs of a resin sealed type semiconductor device according to a second embodiment of the present invention.

In FIGS. 6–7, owing to convenience of illustration, the number of the posts 202, the solder bumps 203, the connector members 204, the pad 206 and the radiation bumps 701 is limited to a specific number, i.e., two. However, even if the above number is changed, the resin sealed type semiconductor device according to the second preferred embodiment of the present invention is capable of getting the same effect.

Third Embodiment

A resin sealed type semiconductor device according to a third preferred embodiment of the present invention will be described with reference to FIGS. 9–10.

First, the composition of the resin sealed type semiconductor device according to the third preferred embodiment will be described with reference to FIG. 9. FIG. 9 is a cross sectional view showing the resin sealed type semiconductor device according to the third preferred embodiment. Like elements are given like or corresponding reference numerals in the first, second and third preferred embodiments. Thus, dual explanations of the same elements are avoided. The resin sealed type semiconductor device according to the third preferred embodiment of the present invention comprises a semiconductor chip 201, a plurality of posts 202, a plurality of solder bumps 203, a plurality of connector members 204, a sealing resin 205, a plurality of pads 206, a radiation post 207, an insulating film 208, a plurality of radiation bumps 701 and a solder resist layer 901. Owing to convenience of illustration, the number of the pads, the connector members, the posts and the solder bumps is limited in FIG. 9.

The difference among the first, the second and the third preferred embodiments is that the solder resist layer 901 is formed on the surface of the sealing resin 205 and the main surface 207a of the radiation post 207.

The resin sealed type semiconductor device according to the third preferred embodiment of the present invention is capable of radiating the heat generated in the semiconductor chip 201 to its outside by using the posts 202, the solder bumps 203, the radiation post 207 and the radiation bumps 701. Therefore, the resin sealed type semiconductor device according to the third preferred embodiment of the present invention is capable of radiating the heat efficiently as compared with the conventional resin sealed type semiconductor device. Thus, the resin sealed type semiconductor device according to the third preferred embodiment of the present invention is capable of reducing the thermal resistance and controlling high temperature of the semiconductor chip as compared with the conventional resin sealed type semiconductor device. As a result, a longer lifetime can be obtained for the resin sealed type semiconductor device according to the third preferred embodiment. Although the solder resist layer 901 is formed on the surface of the sealing resin 205 and the main surface 207a of the radiation post 207, it goes without saying that the radiation efficiency of the heat generated in the semiconductor chip 201 is not inferior to the conventional resin sealed type semiconductor.

Furthermore, the resin sealed type semiconductor device of the third embodiment of the present invention has the solder resist layer 901. Thus, the solder bumps 203 and the radiation bumps 701 can be stably mounted on the posts 202 and the radiation posts 207, respectively. Even if the size of the solder bumps 203 differs from of the radiation bumps 701, the solder bumps 203 and the radiation bumps 701 can be stably mounted on the posts 202 and the radiation posts 701, respectively, due to the solder resist layer 901.

Therefore, the solder bumps 203 and the radiation bumps 701 can be mounted at the same process. Special processes do not need to be used to form the radiation bumps 701. Thus, the processes can be performed efficiently.

The process of manufacturing the resin sealed type semiconductor device according to the third preferred embodiment of the present invention will be described with reference to FIGS. 10A–10C. The drawings are schematic enlarged sectional views of a part of the wafer. In the following explanations, the solder resist having a photosensitive property is explained as an example of the solder resist layer 901. However, the solder resist layer 901 should not be limited to a photosensitive solder resist. All processes from the process of preparing the wafer 201 (refer to FIG. 4A) to the process of exposing the first end sides 202a of the posts 202 and the main surface 207a of the radiation post 207 (refer to FIG. 5C), are the same as those of the third embodiment.

Figure 10A:
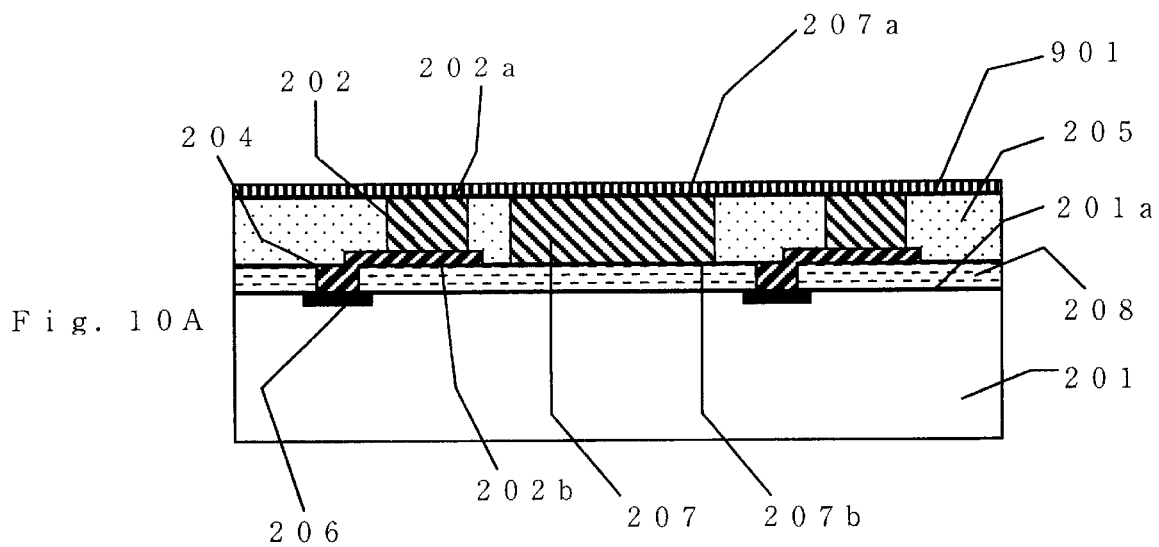
FIG. 10(a) through FIG. 10(c) are process diagrams showing a method for manufacturing a resin sealed type semiconductor device according to a third embodiment of the present invention.
Figure 10B:
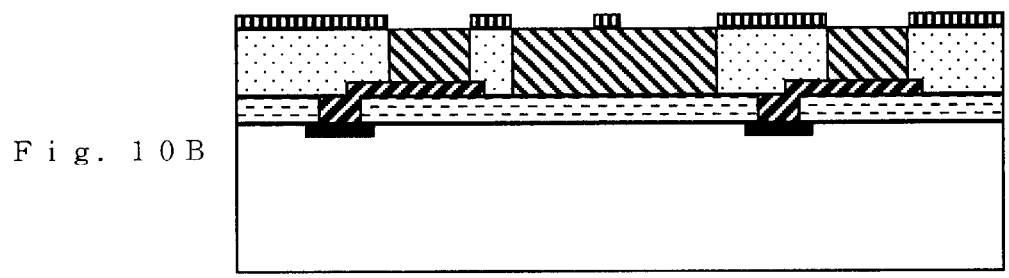
Figure 10C:
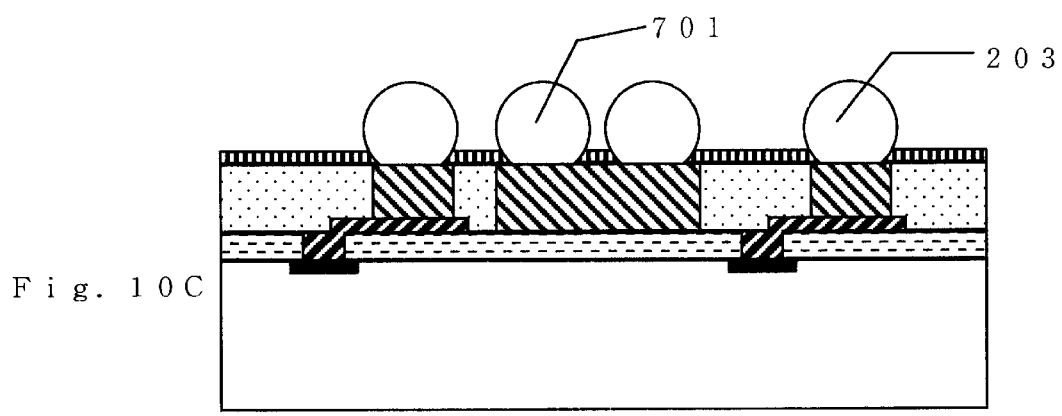

The difference among the first, the second and the third preferred embodiments is that the processes shown in FIGS. 10A–10C are performed instead of the process shown in FIG. 5D. After the process shown in FIG. 5C has been performed, as shown in FIG. 10A, the photosensitive solder resist 901 is spin-coated on the surface of the sealing resin 205, the first end side 202a of the post 202 and the main surface 207a of the radiation post 207, and then the spin-coated photosensitive solder resist 901 is temporarily dried.

Next, as shown in FIG. 10B, the temporarily dried solder resist layer 901 is masked, and the masked solder resist layer 901 is lithographed in order to expose a part of the first end sides 202a of the posts 202 and a part of the main surfaces 207a of the radiation posts 701. The size of the mask is set to the size of the solder bumps 203 and the radiation bumps 701. The exposed solder resist layer 901 is developed, and thus openings are formed in the solder resist layer 901.

Next, as shown in FIG. 10(c), the solder bumps 203 and the radiation bumps 701 are mounted on the exposed first end sides 202a of the posts 202 and the exposed main surfaces 207a of the radiation posts 701 by using the screen-printing method, the solder-plating method or the super-soldering method, etc.

In the process of manufacturing the resin sealed type semiconductor device according to the third preferred embodiment of the present invention, the radiation bumps 701 can be formed simultaneously in the process of forming the solder bumps 203, even if there is a difference between the sizes of the solder bumps 203 and the radiation bumps 701. Therefore, special processes do not need to be used to form the radiation bumps 701. Thus, the processes can be performed efficiently.

Figure 9:
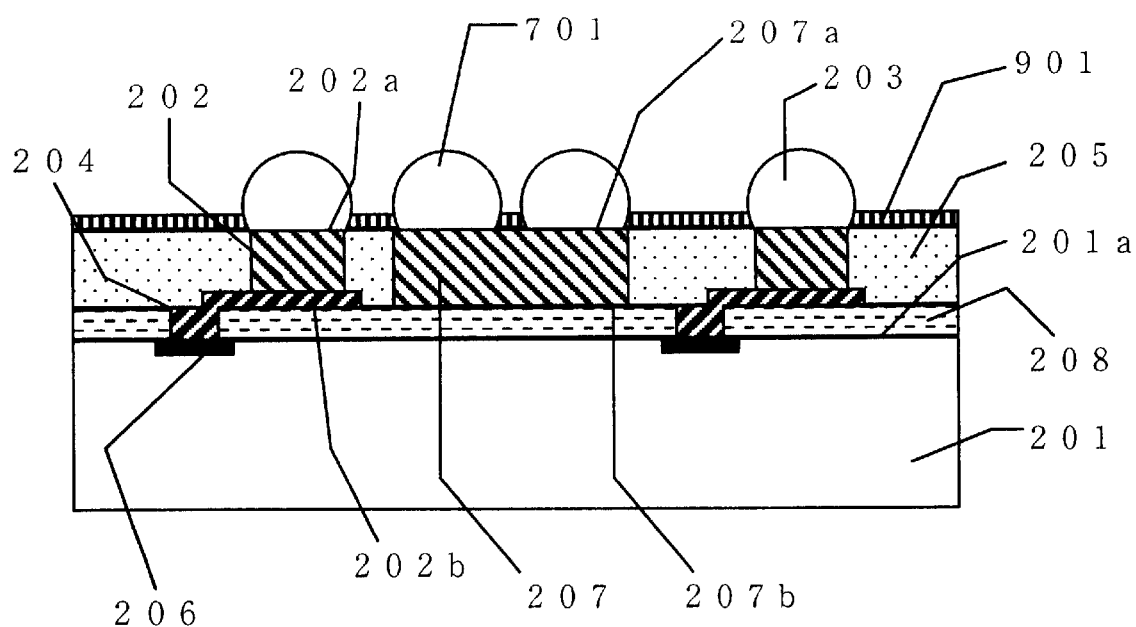
FIG. 9 is a cross sectional view showing a resin sealed type semiconductor device according to a third embodiment of the present invention.

In FIGS. 9–10, owing to convenience of illustration, the number of the posts 202, the solder bumps 203, the connector members 204, the pad 206 and the radiation bumps 701 is limited to a specific number, i.e. two. However, even if the above number is changed, the resin sealed type semiconductor device according to the third preferred embodiment of the present invention is capable of getting the same effect.

Fourth Embodiment

A resin sealed type semiconductor device according to a fourth preferred embodiment of the present invention will be described with reference to FIGS. 11A–11B.

FIG. 11 describes the arrangement relationship between the radiation posts 207 or the solder bumps 203. As shown in FIG. 11, the radiation posts 207 of the fourth embodiment of the present invention are formed at various positions over the main surface 201a of the semiconductor chip 201. FIG. 11 does not show the radiation bumps 701 which are formed on the radiation posts 207. However, it is clear that the radiation bumps 701 are mounted on the radiation posts 207 as in the above mentioned second and third embodiments of the present invention.

Figure 11A:
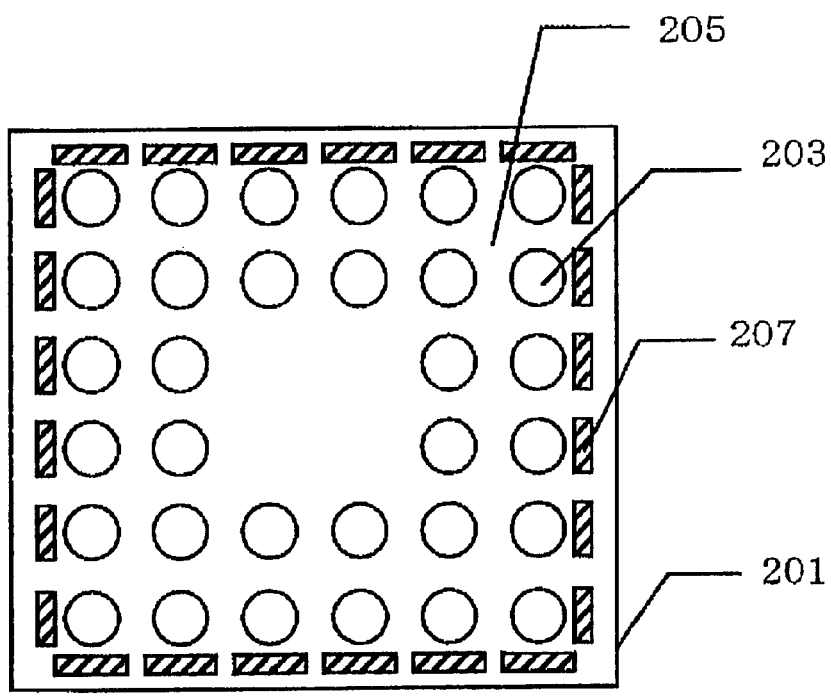
FIG. 11(a) through FIG. 11(b) are plan showing an arrangement relationship between posts and radiation posts.

In FIG. 11A, the radiation posts 207 are formed at the edge area of the semiconductor chip 201. If the radiation posts 207 can not be formed at the central area of the semiconductor chip 201, the resin sealed type semiconductor device shown in FIG. 11A becomes effective.

Figure 11B:
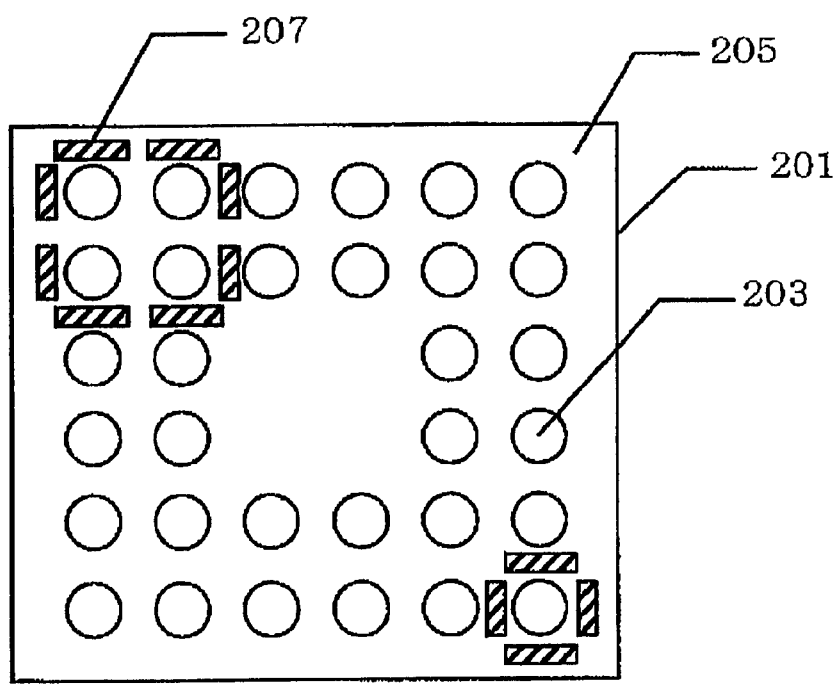
Figure 12:
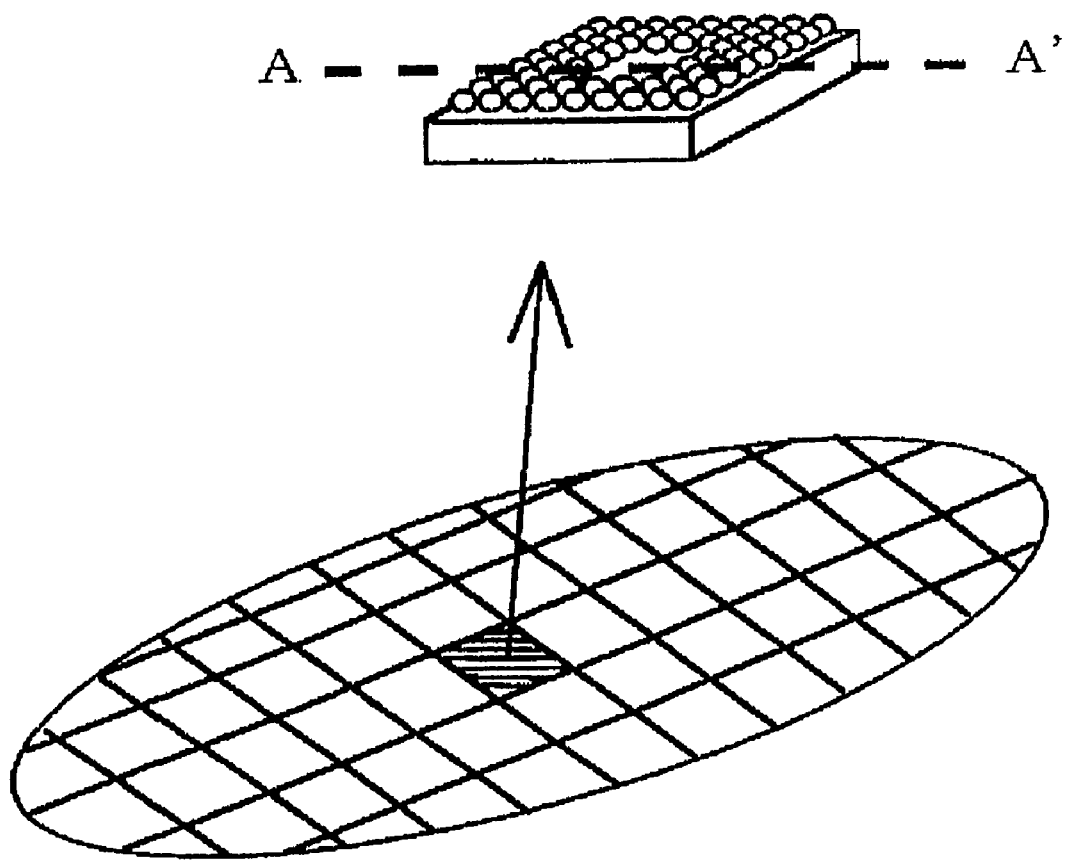
FIG. 12 is a perspective view showing relationship between a wafer and a resin sealed type semiconductor device.
Figure 13:
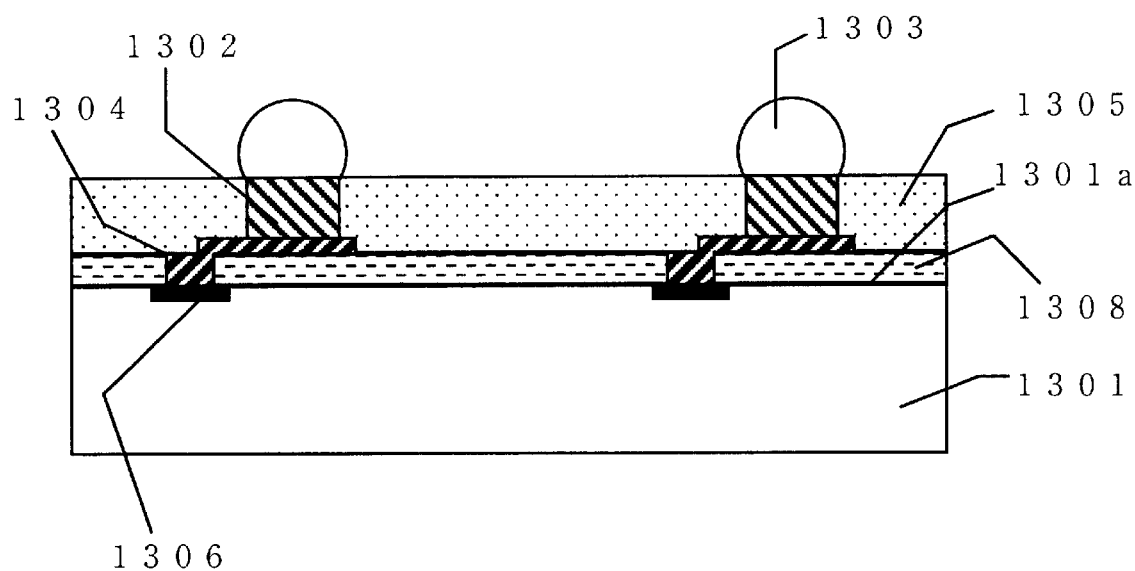
FIG. 13 is a cross sectional view showing a structure of a resin sealed type semiconductor device of the related art.
Figure 14:
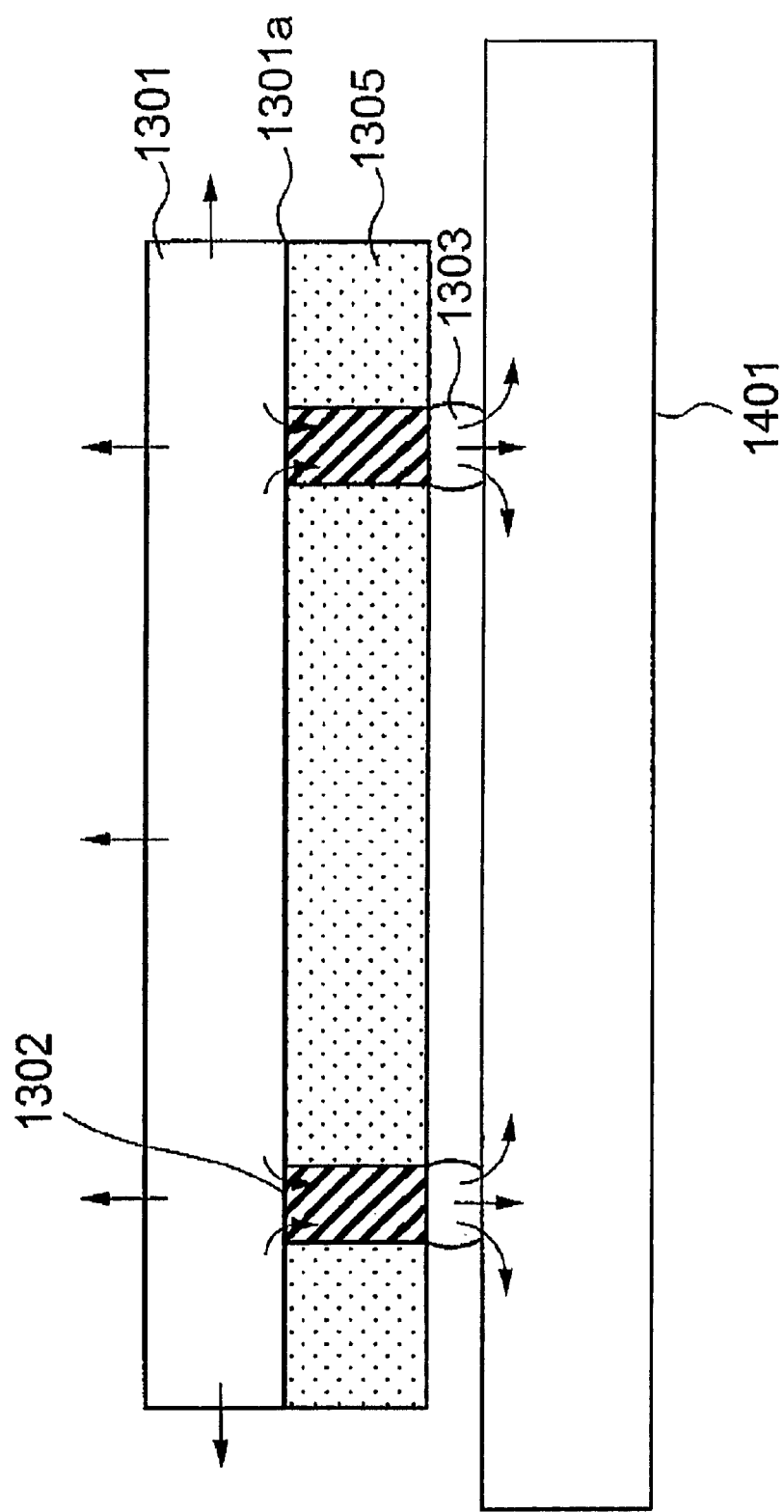
FIG. 14 is a cross sectional view showing a radiation path of a resin sealed type semiconductor device of the related art.

In FIG. 11B, the radiation posts 207 are formed around specific solder bumps 203. The resin sealed type semiconductor device is suitable for radiating the heat of the specific solder bumps 203 which are highly required to radiate the heat.

The resin sealed type semiconductor device according to the fourth preferred embodiment of the present invention is capable of radiating the heat occurred in the semiconductor chip 201 to its outside by using the posts 202, the solder bumps 203, the radiation post 207 and the radiation bumps 701. Therefore, the resin sealed type semiconductor device according to the fourth preferred embodiment of the present invention is capable of radiating the heat efficiently as compared with the conventional resin sealed type semiconductor device. Thus, the resin sealed type semiconductor device according to the fourth preferred embodiment of the present invention is capable of reducing the thermal resistance and controlling high temperature of the semiconductor chip as compared with the conventional resin sealed type semiconductor device. As a result, a longer lifetime can be obtained for the resin sealed type semiconductor device according to the fourth preferred embodiment [having a longer lifetime can be obtained].

While the preferred form of the present invention has been described, it is to be understood that modifications will be apparent to those skilled in the art without departing from the spirit of the invention.

The scope of the invention, therefore, is to be determined solely by the following claims.

What is claimed is:

1. A semiconductor device, comprising:
    a semiconductor chip which has a pad formed on a main surface thereof;
    an insulating film which is formed on a part of said pad and on said main surface of said semiconductor chip;
    an interconnection which is formed on a part of said insulating film and which is electrically connected to said pad;
    a sealing resin which seals said interconnection and said insulating film;
    a post formed on said interconnection which has a surface exposed to outside of said sealing resin and which is electrically connected to said interconnection;
    a bump electrode which is mounted on said exposed surface of said post; and
    a radiation post which is formed on said insulating film and which has a surface exposed outside of said sealing resin.

2. The semiconductor device in accordance with claim 1, said semiconductor device further comprising:
    a radiation bump unit which is formed on said exposed surface of said radiation post.

3. The semiconductor device in accordance with claim 2, wherein a portion of said radiation bump is substantially spherical in shape.

4. The semiconductor device in accordance with claim 1, wherein
   said radiation post is provided over the center of said main surface of said semiconductor chip; and
   said post is provided over the periphery of said main surface of said semiconductor chip.

5. The semiconductor device in accordance with claim 4, said semiconductor device further comprising: a radiation bump which is formed on said exposed surface of said radiation post.

6. The semiconductor device in accordance with claim 1, wherein said radiation post is provided at an outermost portion of said main surface of said semiconductor chip.

7. The semiconductor device in accordance with claim 6, said semiconductor device further comprising:
   a radiation bump which is formed on said exposed surface of said radiation post.

8. The semiconductor device in accordance with claim 7, wherein a portion of said radiation bump is substantially spherical in shape.

9. The semiconductor device in accordance with claim 1, wherein said radiation post is provided around said post that is formed on said interconnection.

10. The semiconductor device in accordance with claim 9, said semiconductor device further comprising:
    a radiation bump which is formed on said exposed surface of said radiation post.

11. The semiconductor device in accordance with claim 10, wherein a portion of said radiation bump is substantially spherical in shape.

12. A semiconductor device comprising:
    a semiconductor chip which has a plurality of pads formed on a main surface thereof;
    an insulating film which is formed on a part of said pads and on said main surface of said semiconductor chip;
    a plurality of interconnections, each of which is formed on a part of said insulating film and which is electrically connected to a corresponding one of said pads;
    a sealing resin which seals said interconnections and said insulating film;
    a plurality of first posts, each of which is formed on a corresponding one of said interconnections and has a surface exposed to the outside of said sealing resin, each of said first posts being electrically connected to corresponding one of said interconnetions;
    a plurality of first bump electrodes, each of which is mounted on said exposed surface of a corresponding on of said first posts; and
    at least on second post which is formed on said insulating film and which has a surface exposed outside of said sealing resin, the at least one second post being electrically isolated from said pads.

13. The semiconductor device in accordance with claim 12, further comprising:
    at least one second bumpwhich is formed on said exposed surface of said at least one second post.

14. The semiconductor device in accordance with claim 13, wherein a portion of each said at least one second bump is substantially spherical in shape.

15. The semiconductor device in accordance with ciaim 12, wherein said at least one second post includes a second post that is provided over the center of said main surface of said semiconductor chip; and
    each of said first posts is provided over a peripheral portion of said main surface of said semiconductor chip.

16. The semiconductor device in accordance with claim 15, further comprising:
    at least one second bump which is formed on said exposed surface of said at least one second post.

17. The semiconductor device in accordance with claim 12, wherein each said at least one second post is piovided at an outermost portion of said main surface of said semiconductor chip.

18. The semiconductor device in accordance with claim 17, further comprising:
    at least one second bump which is formed on said exposed surface of said at least one second post.

19. The semiconductor device in accordance with claim 18, wherein a portion of each said at least one second bump is substantially spherical in shape.

20. The semiconductor device in accordance with claim 12, wherein each said at least one second post is provided around a first post that is formed on said interconnections.

21. The semiconductor device in accordance with claim 20, further comprising:
    at least one second bump which is formed on said exposed surface of said at least one second post.

22. The semiconductor device in accordance with claim 21, wherein a portion of each said at least one second bump is substantially spherical in shape.

23. The semiconductor device in accordance with claim 12, wherein second said at least one second post is not connected to said interconnections and said first posts.

* * * * *